(12) United States Patent
Gruner et al.

(10) Patent No.: US 9,294,085 B1
(45) Date of Patent: Mar. 22, 2016

(54) HIGH-VOLTAGE, LOW-INDUCTANCE GAS SWITCH

(71) Applicants: Frederick R. Gruner, Cedar Crest, NM (US); Sandia Corporation, Albuquerque, NM (US)

(72) Inventors: Frederick R. Gruner, Cedar Crest, NM (US); William A. Stygar, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 270 days.

(21) Appl. No.: 14/099,524

(22) Filed: Dec. 6, 2013

Related U.S. Application Data

(60) Provisional application No. 61/752,259, filed on Jan. 14, 2013.

(51) Int. Cl.
*H01J 7/24* (2006.01)
*H03K 17/52* (2006.01)

(52) U.S. Cl.
CPC ..................................... *H03K 17/52* (2013.01)

(58) Field of Classification Search
USPC ........................................ 315/111.01–111.91
See application file for complete search history.

(56) References Cited

U.S. PATENT DOCUMENTS

| 3,408,527 | A | * | 10/1968 | Michel | H01J 17/14 313/156 |
| 3,592,988 | A | * | 7/1971 | Pucher | H01H 33/42 218/149 |
| 5,146,141 | A | * | 9/1992 | Rohde | H01T 2/02 313/590 |
| 6,026,099 | A | * | 2/2000 | Young | H01S 4/00 372/25 |
| 2007/0205001 | A1 | * | 9/2007 | Shuster | B21D 39/04 166/380 |

OTHER PUBLICATIONS

J.R. Woodworth et al., Low-Inductance Gas Switches for Linear Transformer Drivers, Phys. Rev. STAB, vol. 12, 060401 (2009).
M.E. Savage et al., High Reliability Low Jitter 80 kV Pulse Generator, Phys. Rev. STAB, vol. 12, 080401 (2009).

* cited by examiner

*Primary Examiner* — Brandon S Cole
(74) *Attorney, Agent, or Firm* — Kevin W. Bieg

(57) ABSTRACT

A low-inductance, air-insulated gas switch uses a de-enhanced annular trigger ring disposed between two opposing high voltage electrodes. The switch is DC chargeable to 200 kilovolts or more, triggerable, has low jitter (5 ns or less), has pre-fire and no-fire rates of no more than one in 10,000 shots, and has a lifetime of greater than 100,000 shots. Importantly, the switch also has a low inductance (less than 60 nH) and the ability to conduct currents with less than 100 ns rise times. The switch can be used with linear transformer drives or other pulsed-power systems.

9 Claims, 16 Drawing Sheets

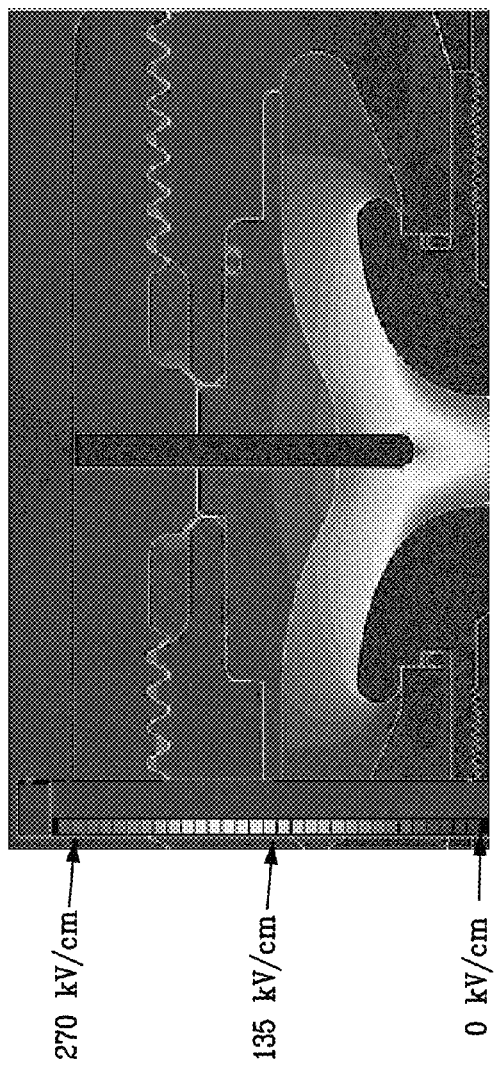
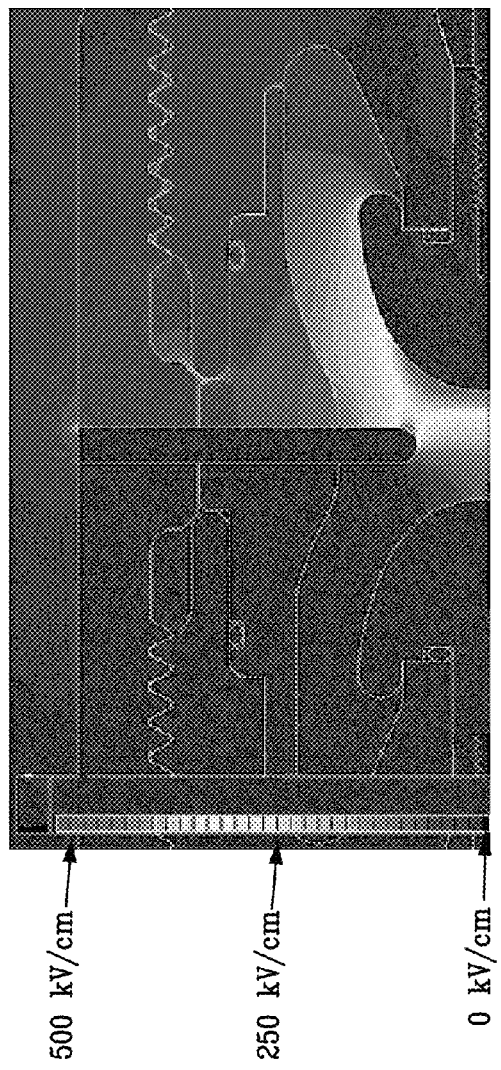

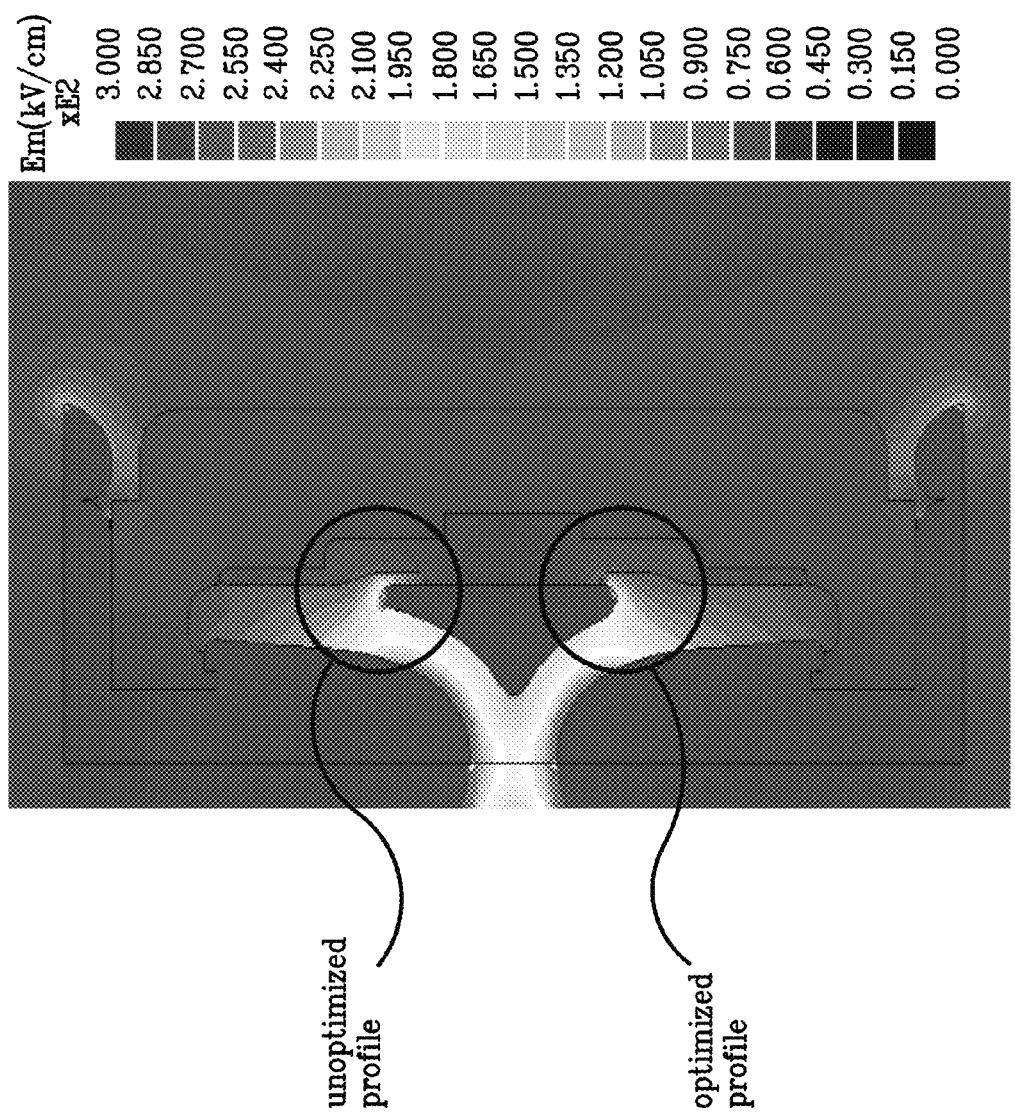

HIGH-VOLTAGE, LOW-INDUCTANCE GAS SWITCH

CROSS-REFERENCE TO RELATED APPLICATION

This application claims the benefit of U.S. Provisional Application No. 61/752,259, filed Jan. 14, 2013, which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to pulsed-power technology and, in particular, to a high-voltage, low-inductance gas switch that can be used in linear-transformer-driver cavities.

BACKGROUND OF THE INVENTION

Linear transformer drivers (LTDs) are a relatively new technology being developed because of their potential to provide high performance and greater versatility of applications at a significantly reduced cost. LTDs can potentially achieve compactness and low cost by going directly from DC-charged capacitors to a 100-ns pulse propagating on a vacuum or water transmission line, without any of the pulse-compression sections normally associated with large pulsed-power drivers. See E. A. Weinbrecht et al., Proc. $15^{th}$ IEEE Pulsed Power Conf., 170 (2005); D. Johnson et al., Proc. $15^{th}$ IEEE Pulsed Power Conf., 314 (2005); I. D. Smith et al., IEEE Trans. Plasma Sci. 28, 1653 (2000); J. J. Ramirez et al., Proc. $7^{th}$ IEEE Pulsed Power Conf., 26 (1989); K. R. Lechien et al., Phys. Rev. ST Accel. Beams 11, 060401 (2009); J. R. Woodworth et al., IEEE Trans. Plasma Sci. 32, 1778 (2004); and P. Sincerny et al., Proc. $11^{th}$ IEEE Pulsed Power Conf., 698 (1997). However, in order to induce a voltage pulse in a magnetically insulated vacuum transmission line with a ~70 ns or less rise time, the inductance of the capacitors, switch, and the transmission line leading to the vacuum section of the LTD must be minimized.

Therefore, the switches required to power LTDs must be reliable and perform within precise parameters that include low inductance, low jitter, and high longevity. In particular, LTDs require gas switches that can be DC charged to ~200 kV, triggered with ~5-10 ns one sigma jitter, be low inductance, have very low prefire and no-fire rates, and have lifetimes of at least several thousand shots. See J. R. Woodworth et al., Phys. Rev. ST Accel. Beams 12, 060401 (2009), which is incorporated herein by reference. FIG. 1 shows a cross-sectional side view illustration of a prior gas switch 10 designed by Kinetech, LLC and described in Woodworth et al. This switch 10 is axially symmetric about a centerline. The distance between electrodes 11 and 12 can be varied by screwing the insertable end pieces 13 and 14 in and out along the threads in the main outer "barrel" housing 15. The switch with the threads screwed in as far as possible provides the lowest possible inductance configuration. In this configuration, the switch has a diameter of 7.5 cm and is 12 cm long. The end caps 16 and 17 of the switch are clamped in split rings that can bolt directly to the ends of the LTD capacitors. This switch has two hemispherical electrodes 11 and 12 with a 0.95-cm spacing therebetween. Four trigger pins 18 are used instead of one to minimize erosion of the trigger pins that can otherwise limit the lifetime of the switch. The four 0.3-cm diameter trigger pins 18 extend inwardly from the midplane of the housing 15 towards the center of the switch. The spark gap between each trigger pin 18 and the main electrodes 11 and 12 is 0.5 cm. The electrodes 11 and 12 are a copper-tungsten alloy, the trigger pins 18 are pure tungsten, and the end caps 16 and 17 are an aluminum alloy. The gas inlet and outlet ports are also on the midplane of the switch. The outer insulators 13 and 14 and housing 15 are a glass-fiber loaded ULTEM™ plastic and the inner liner 19 is Kel-F™ plastic. The entire switch 10 can be submerged in an insulating fluid during operation.

Since the discharge normally occurs from one electrode to a trigger pin and then from the trigger pin to the other electrode, this switch effectively has two 0.5-cm spark gaps. FIG. 2A shows an electrostatic field plot of the prior switch with 200 kV between the electrodes. For this two-dimensional simulation, the trigger pins were approximated as an annular sheet on the switch midplane. The maximum electric field at the surface of the electrodes was 270 kV/cm. FIG. 2B shows an electrostatic field plot of this switch with the trigger pin at +100 kV as the trigger pulse arrives at the switch. The peak electric field in the switch when the trigger pulse arrives was slightly over 500 kV/cm. This prior switch was very robustly designed, relatively simple, and triggered with less than 5 ns jitter. However, it operated at relatively high pressure (e.g., 242 psia) which can pose problems in some applications. Further, the switch's inductance was surprisingly high (e.g., 100 nH) for a switch this small.

Therefore, a need remains for a high-voltage, low-inductance gas switch that can be used with LTDs and other pulsed-power systems.

SUMMARY OF THE INVENTION

The present invention is directed to a high-voltage, low-inductance gas switch, comprising a hollow housing pressurized with a gas; a pair of axially symmetric opposing high voltage electrodes spaced apart and located on a centerline within the pressurized housing; and an annular trigger ring disposed on a midplane between the opposing high voltage electrodes, wherein the surfaces of the trigger ring and the opposing high voltage electrodes are shaped to provide a uniform electric field in the gap formed therebetween. The surfaces of the high voltage electrodes can have a modified Rogowski profile and the annular trigger ring can have a double concave (de-enhanced) inner surface to provide the uniform electric field. For example, the pressurized gas can comprise dry air, nitrogen, hydrogen, or sulfur hexafluoride. The housing is preferably cylindrically symmetric about the centerline with internal threads on each end and each high voltage electrode can be mounted on an externally threaded insulating end piece that can be rotatably inserted into opposing ends of the housing, thereby enabling adjustment of the spacing of the electrodes therebetween. The annular trigger ring can be mounted on the inside wall of an insulating tubular liner and the outside wall of the tubular liner can be compressibly sealed to the inner wall of the housing when the housing is pressurized. At least one spark plug can be provided at the midplane to provide a spark to pre-ionize the pressurized gas.

The gas switch can be air-insulated, DC chargeable to 200 kilovolts or more, triggerable, have a low jitter (5 ns or less), have pre-fire and no-fire rates of no more than one in 10,000 shots, and have a lifetime of greater than 100,000 shots.

Importantly, the switch also has a low inductance (less than 60 nH) and the ability to conduct currents with less than 100 ns rise times.

BRIEF DESCRIPTION OF THE DRAWINGS

The detailed description will refer to the following drawings, wherein like elements are referred to by like numbers.

FIGS. 2A and 2B are plots of electric field intensities inside the prior switch when charged to +1-100 kV. FIG. 2A is a plot of DC charge with the trigger pins at ground. FIG. 2B is a plot of the fields in the switch when the trigger pins are at +100 kV during the triggering process.

FIG. 4 is an electric field plot inside the gas switch, showing a more uniform field after profile adjustment.

DETAILED DESCRIPTION OF THE INVENTION

Figure 1:
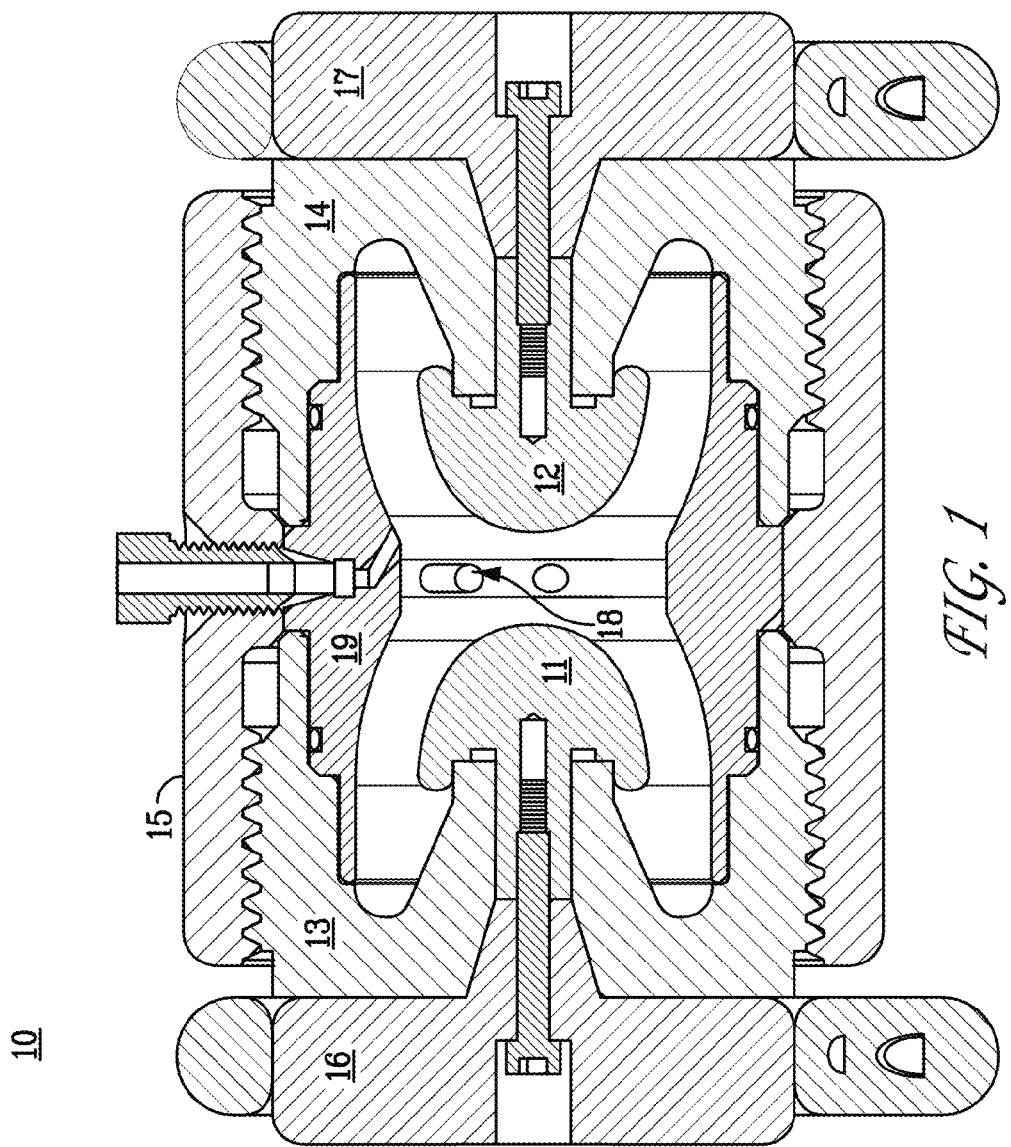
FIG. 1 is a cross-sectional side view schematic illustration of a prior gas switch.
Figure 3A:
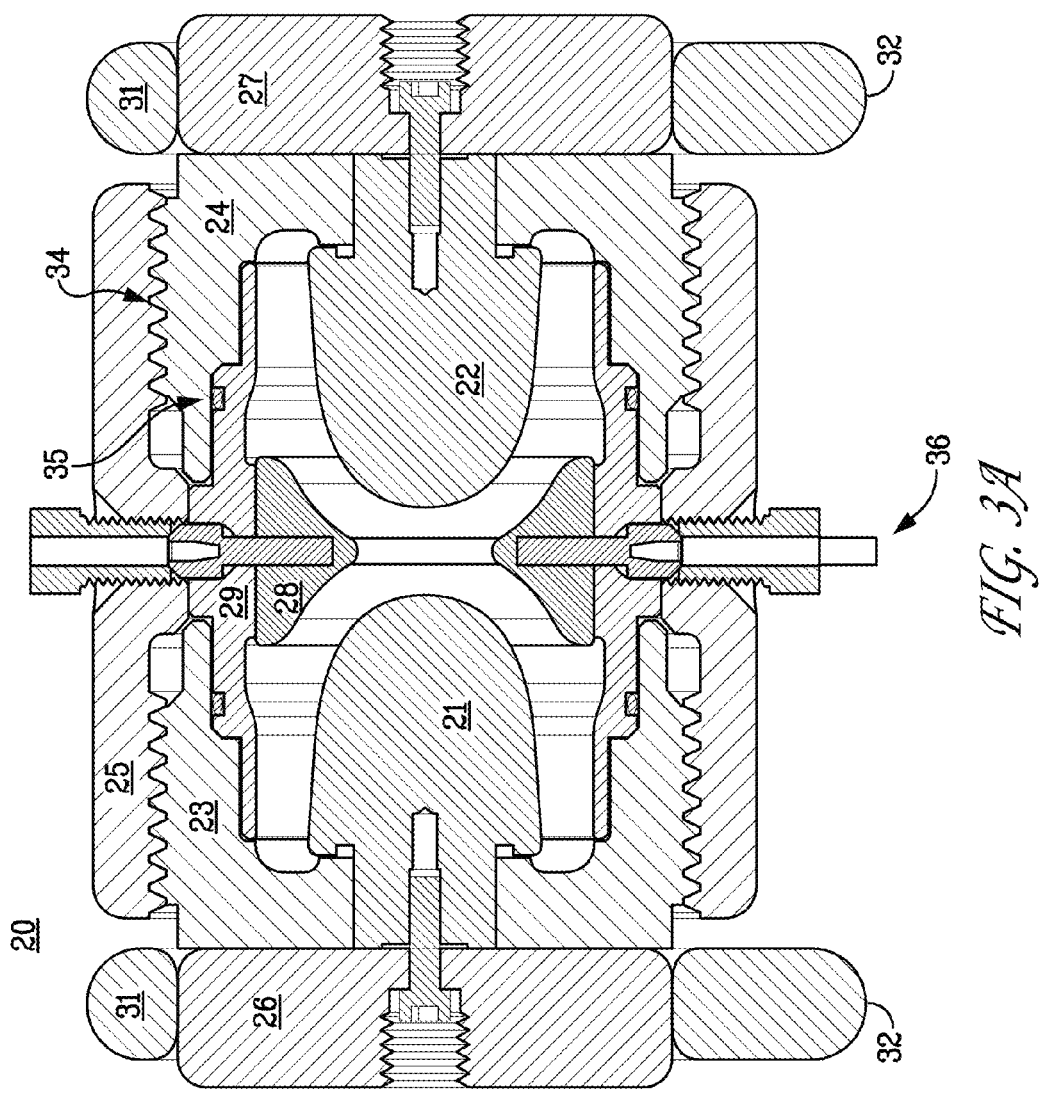
FIG. 3A is a cross-sectional side view schematic illustration of an exemplary gas switch of the present invention.
Figure 3B:
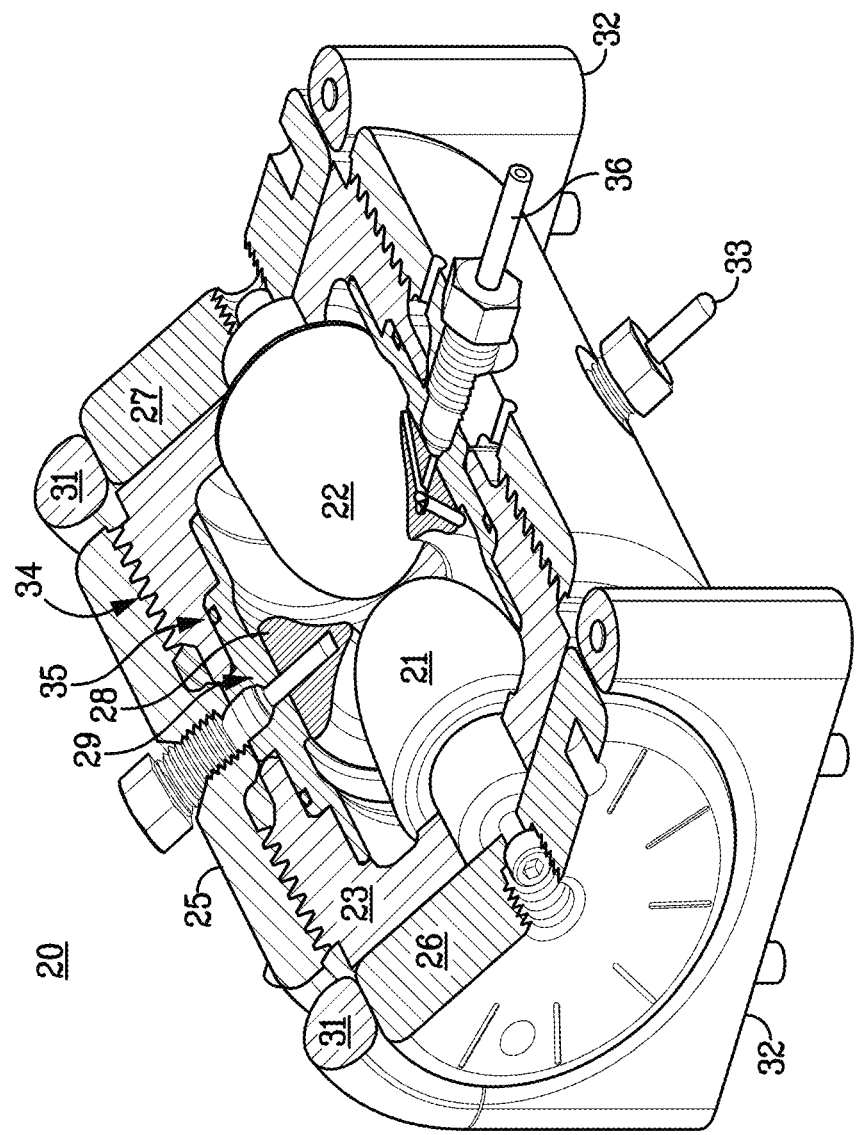
FIG. 3B is a cutaway view schematic illustration of the gas switch.
Figure 3C:
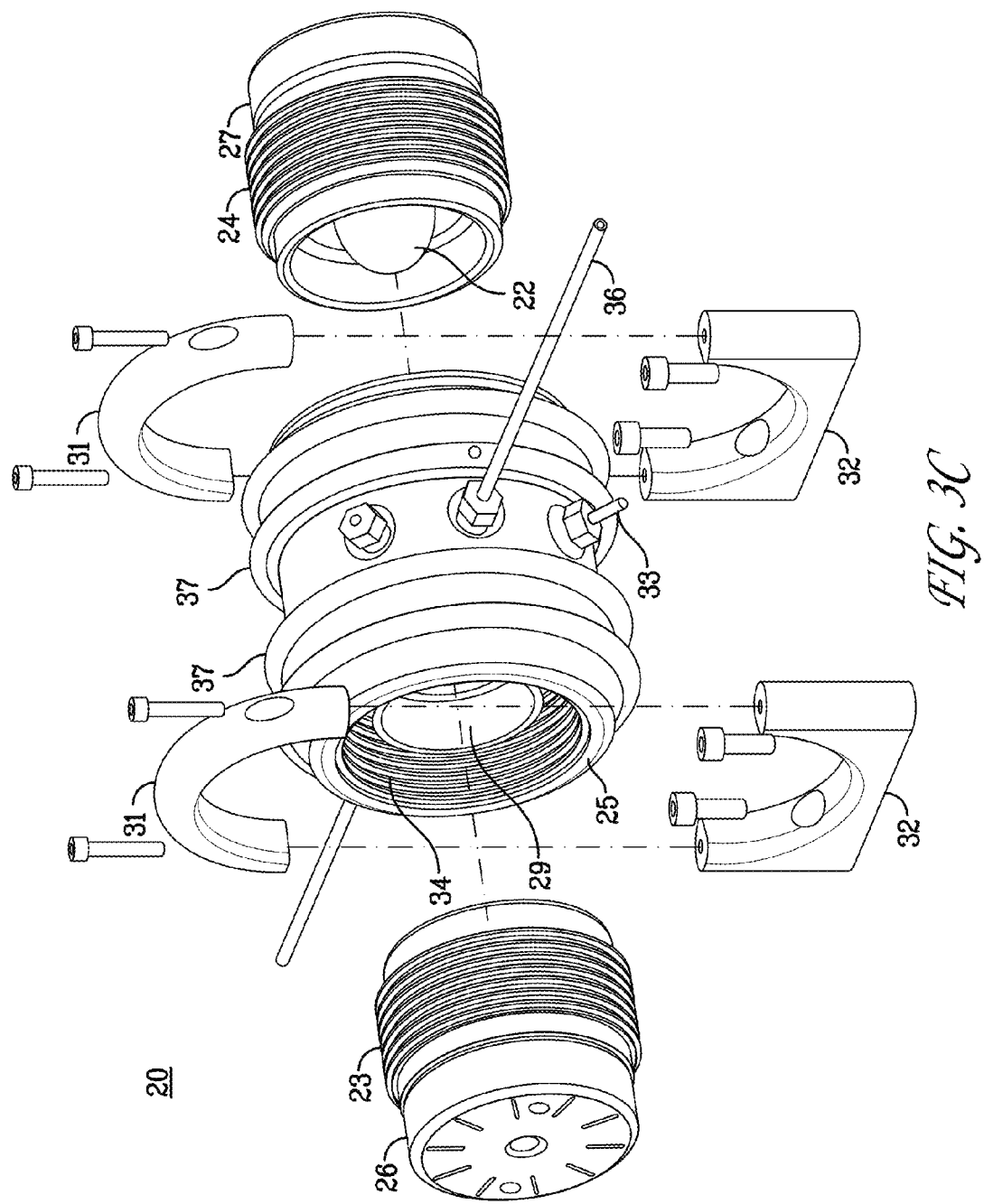
FIG. 3C is an exploded view illustration of the gas switch.

FIG. 3A is a cross-sectional side view illustration of an exemplary high-voltage, low-inductance gas switch 20 of the present invention. FIG. 3B is a cutaway perspective view illustration of the gas switch 20. FIG. 3C is an exploded view illustration of the gas switch 20 which shows the dissembled switch. The gas switch 20 is preferably axially symmetric about a centerline. The switch 20 comprises an insulating hollow housing 25 that can be internally threaded to contain a high pressure gas. For example, the housing 25 can comprise a reinforced plastic (e.g., glass-reinforced polyetherimide or Nylon 66) or other suitable high-strength insulating material. Importantly, the switch 20 comprises a midplane annular trigger ring 28 having a double concave inner profile that wraps completely around the ends of opposing high-voltage electrodes 21 and 22. The inner profile of the trigger ring 28 and the ends of opposing high voltage electrodes 21 and 22 can be shaped to provide a uniform electric field for the axially symmetric system. For example, the surfaces of the electrodes 21 and 22 can be shaped to have a modified Rogowski profile. The electrodes 21 and 22 and trigger ring 28 can be made of an ablation-resistant, electrically conductive, and easy-to-machine material, such as a copper-tungsten alloy. The trigger ring 28 can have enough mass and surface area to reliably survive 100,000 shots. The opposing electrodes 21 and 22 are spaced apart and the anode-cathode (A-K) gap between them can be adjustable (e.g., from 0.404" to 1.154"), enabling the switch to operate at lower pressures, or voltages above 200 kV. An insertable, externally threaded insulating end piece 23 or 24 can be captured between each electrode 21 or 22 and an electrically conducting end cap 26 or 27. Therefore, the switch gap can be adjusted by simply rotating the end caps 26 and 27 without having to remove the entire switch from the insulating fluid for adjustment. The adjustment is possible because of internal Whitworth threads 34 that reduce the stress in the outer housing 25, and sliding O-rings 35 on the outer wall of an insulating tubular liner 29 which are compressed by the internal pressure of the switch. Therefore, the pressurized gas is contained by the internal Whitworth threads, rather than by longitudinal external rods as with some prior gas switches. The liner 29 can be one piece and can be made of polychlorotrifluoroethylene (PTCFE) or other suitable insulator material. In addition to providing sealing for the gas envelope, the liner 29 also provides UV protection to the housing 25 and end pieces 23 and 24. The inner wall of the liner 29 can be shaped to accept the trigger ring 28 and can be undercut behind the trigger ring 28 to prevent the shockwave of the arc from damaging the insulator and causing pre-fires. Gas inlet and outlet ports 33 with cooling passages for purged dry air or other insulating gas can also be on the midplane of the switch. The trigger ring 28 can further comprise modified spark plugs 36 centrally located on the midplane of the trigger ring to provide a spark for pre-ionizing the insulating gas. The end caps 26 and 27 can be clamped in split rings 31 and 32 that can bolt directly to the ends of the LTD capacitors. The entire switch and LTD capacitors can be submerged in an insulating fluid (e.g., oil) during operation. As shown in FIG. 3C, the housing 25 can further comprise external ribs 37 to inhibit flashover in the insulating fluid. The end caps 26 and 27 can be DC charged oppositely to high voltage and induce a voltage pulse on the opposite ends of the LTD capacitors when triggered.

For reliable triggering and self-break voltage scalability, a de-enhanced (concave) gap can be used on the annular trigger ring in which a uniform field can be created to lower the total inductance. See M. E. Savage and B. S. Stoltzfus, *Phys. Rev. ST Accel. Beams* 12, 080401 (2009), which is incorporated herein by reference. The switch can also be made to eliminate electric field hot spots, thereby enabling it to perform better and prevent tracking of the insulator. The electric field intensity projected for the switch can be iterated to optimize the trigger ring profile for the electric fields. For example, FIG. 4 shows electric field plots of the trigger ring—electrode gap before and after optimization of the trigger ring profile. The optimized geometry can be translated to CAD files and used in the fabrication of the parts. The unique electric field shaping between the de-enhanced (concave) annular trigger ring and the modified Rogowski electrodes causes the performance of the gas switch to be dependent on its geometry, unlike prior gas switches that use hemispherical electrodes and simple trigger pins. In particular, the de-enhanced annular trigger ring and uniquely defined geometry significantly reduces inductance compared to the prior switches that use highly enhanced trigger pins.

Figure 5:
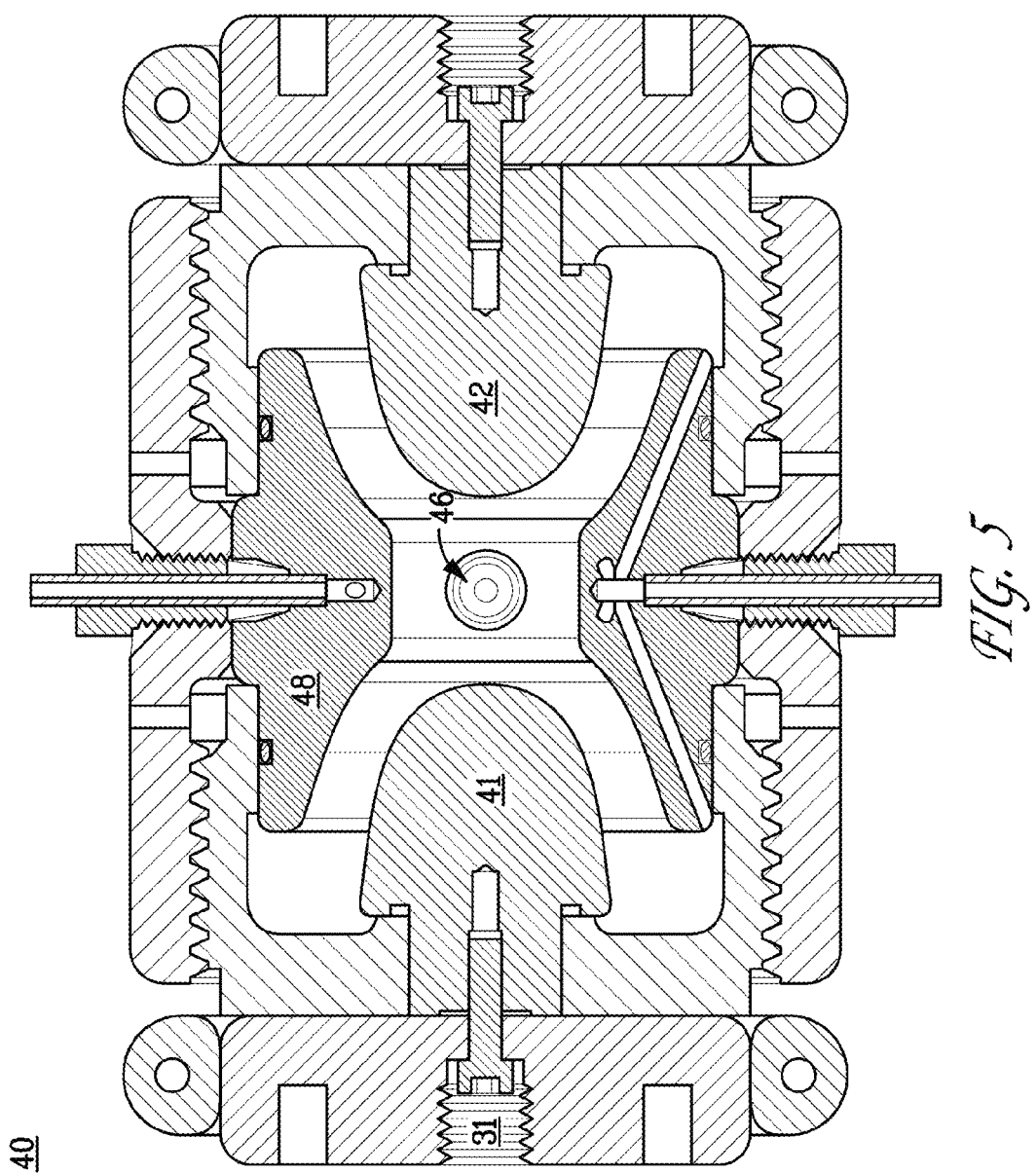
FIG. 5 is a cross-sectional side view schematic illustration another gas switch embodiment of the present invention.
Figure 6:
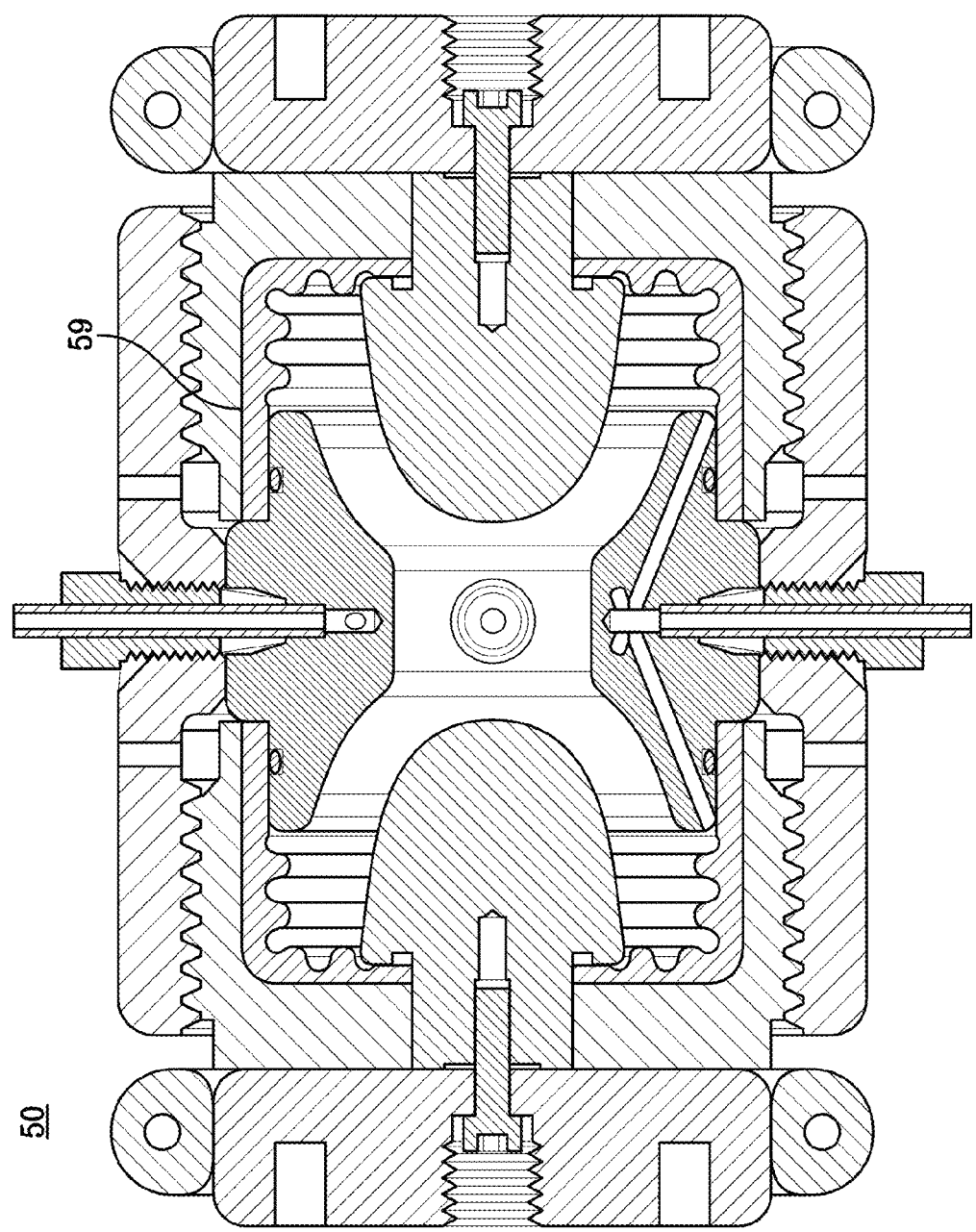
FIG. 6 is a cross-sectional side view schematic illustration another gas switch embodiment of the present invention.

FIGS. 5 and 6 shows cross-sectional side view illustrations of other exemplary embodiments of the present invention. FIG. 5 shows an exemplary switch 40 that has reprofiled electrodes 41 and 42, a larger wrap-around midplane trigger ring 48, and a centrally located pre-ionizing spark plug 46. The pre-ionizing spark can reduce jitter. FIG. 6 shows a similar exemplary switch 50 that further comprises an insulating inner liner 59.

Testing of the Gas Switch

Figure 7:
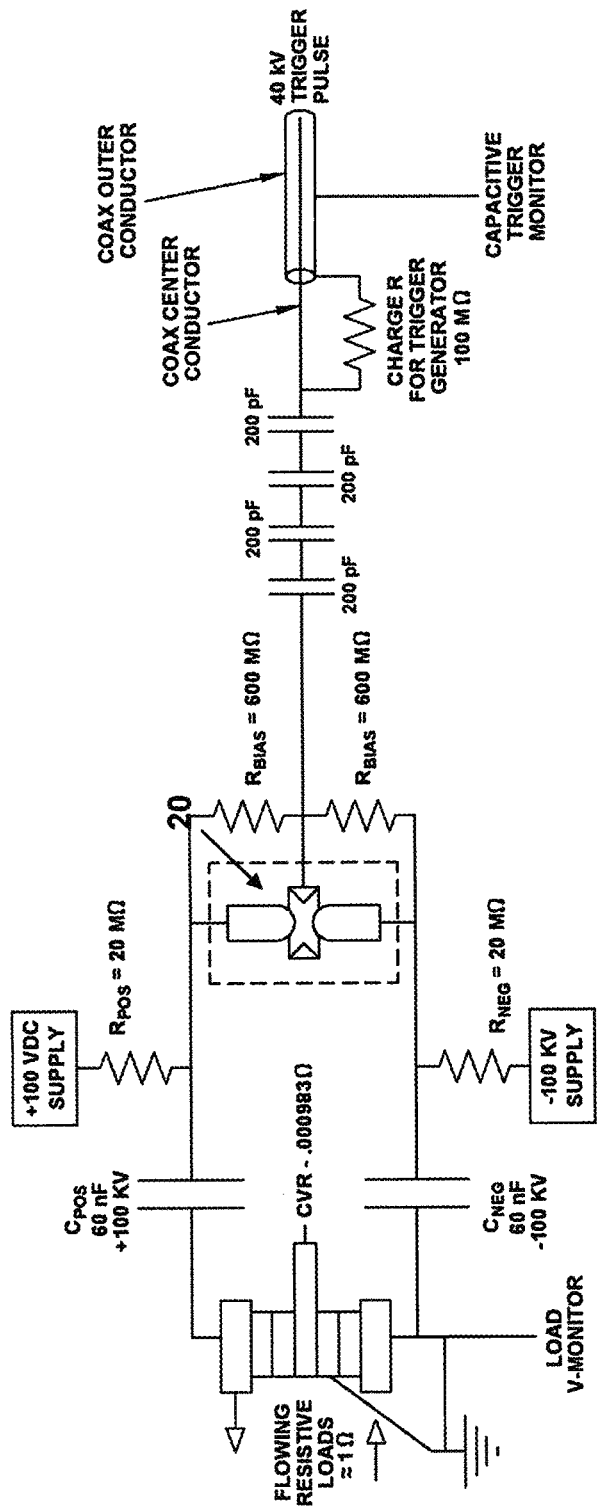
FIG. 7 is a schematic illustration of an LTD brick electrical circuit for switch testing.

A switch test apparatus was constructed that uses the capacitors and brick design of an LTD. FIG. 7 shows the electric circuit for the test apparatus, including the LTD brick. Table 1 shows the specifications for the test apparatus. The test brick shown comprises two capacitors, a triggered gas switch 20, and a flowing resistive load. The two 60 nF capacitors are DC charged to opposite polarities with the gas switch between their high-voltage outputs. In an LTD system, the other ends of the capacitors would normally be coupled to a vacuum transmission line cavity. However, in the test apparatus the other ends of the capacitors are simply connected to each other through the liquid resistive load. A current-viewing resistor (CVR) is placed between the two halves of the flowing load to monitor the current in the circuit. The trigger system has a coaxial arrangement that has a fast rise time (1 ns) at 40 kV. The entire test apparatus is submerged in a tank filled with insulating fluid. When the switch is triggered and conducts current, a voltage pulse is induced on the opposite ends of the capacitors, driving a current through the flowing load resistor. See J. R. Woodworth et al., *Phys. Rev. ST Accel. Beams* 12, 060401 (2009); and I. A. Smith, *Phys. Rev. ST Accel. Beams* 7, 064801 (2004). The test apparatus could be charged to relatively low voltages and fired with a small gas switch to determine the inductance of the brick assembly with the CVR and the flowing load resistor. A Swagelok filter was added to the test apparatus to remove dust and particles, preventing them from flowing through the switch when it was purged. The particle remover rate was >99.9999999% at 0.003 microns, and the maximum flow rate of the filter was 225 liters/minute. This filter was installed in the purge air supply line immediately before the switch. This was done to remove any possibility of prefires due to particles which may have entered the switch. The oil was evacuated and degassed before it was pumped into the tank. There is a pump filter to keep the oil clean and circulated and an oil cooler to control the temperature

TABLE 1

Test apparatus specifications.

| | |
|---|---|
| Power supplies | ±100 kV 2.5 mA Glassman High Voltage Power Supplies |
| Trigger generator | 1 ns rise time 40 kV coaxial ASR Corporation/Kinetech Trigger Generator (Positive Pulse) |
| Automated control system | ASR Corporation controls and software |
| Insulating fluid | Shell Dial-AX degassed, filtered, and cooled |
| Test tank | 24" H x 24" W x 24" D Polyethylene |
| Gas switch insulating gas | Ultra Zero Air Grade 0.1 Certified <2 ppm $H_2O$ |
| Purge air filter in line before gas switch | Swagelok 0.003 micron 225 liters/minute high purity filter |
| CVR | 0.000983 Ω |
| Capacitors (2 in series) | General Atomics 60 nF double ended 0.580 J total energy stored |
| System inductance (calculated) | 149.9 nH |
| Measured load resistance | 0.926 Ω |

An exemplary gas switch was tested using the test apparatus. The specifications for the gas switch tested are shown in Table 2. The tested gas switch was designed to use different gasses including hydrogen, which operates at much higher pressures. Because of this, the switch is very robust and can survive arcs in any area surrounding the switch including the failure of capacitors. Finite element analysis determined that the minimum safety factor at 250 psi was 5.43. The switch was operated at 200 psi for these tests. No leaks or mechanical failures occurred during testing.

TABLE 2

Test specifications for first exemplary switch.

Design Specifications

| | |
|---|---|
| Initial DC voltage across the switch | 200 kV in a balanced ±100 kV configuration |
| Size | 2.75" diameter with a length of 4.75" |
| Operating pressure range | 1 atm to 1,080 psi |
| Current capacity | Tested to 80 kA, designed to 120 kA max |
| Gasses | Zero air, $N_2$, $SF_6$, and $H_2$ (for high rep-rates) |
| Nominal electrode diameter | 1" |
| Anode-Cathode (A-K) gap at the center of the switch | 0.404" The switch only fires across this gap in self-break mode. |
| Uniformity of the electric field across the electrodes | See field plot in FIG. 4 |
| Minimum safety factor at 250 psi | 5.43 |

Materials Specifications

| | |
|---|---|
| Housing | Glass-reinforced polyetherimide (PEI) or glass-reinforced Nylon 66 |
| Insulator | Polychlorotrifluoroethylene (PCTFE) |
| Electrodes | 25% copper, 75% tungsten |
| Trigger ring | Brass, or CuW75 |
| O-rings | Viton |
| Gas lines | 1/8" OD PEEK |
| End caps | Aluminum |

Figure 8:
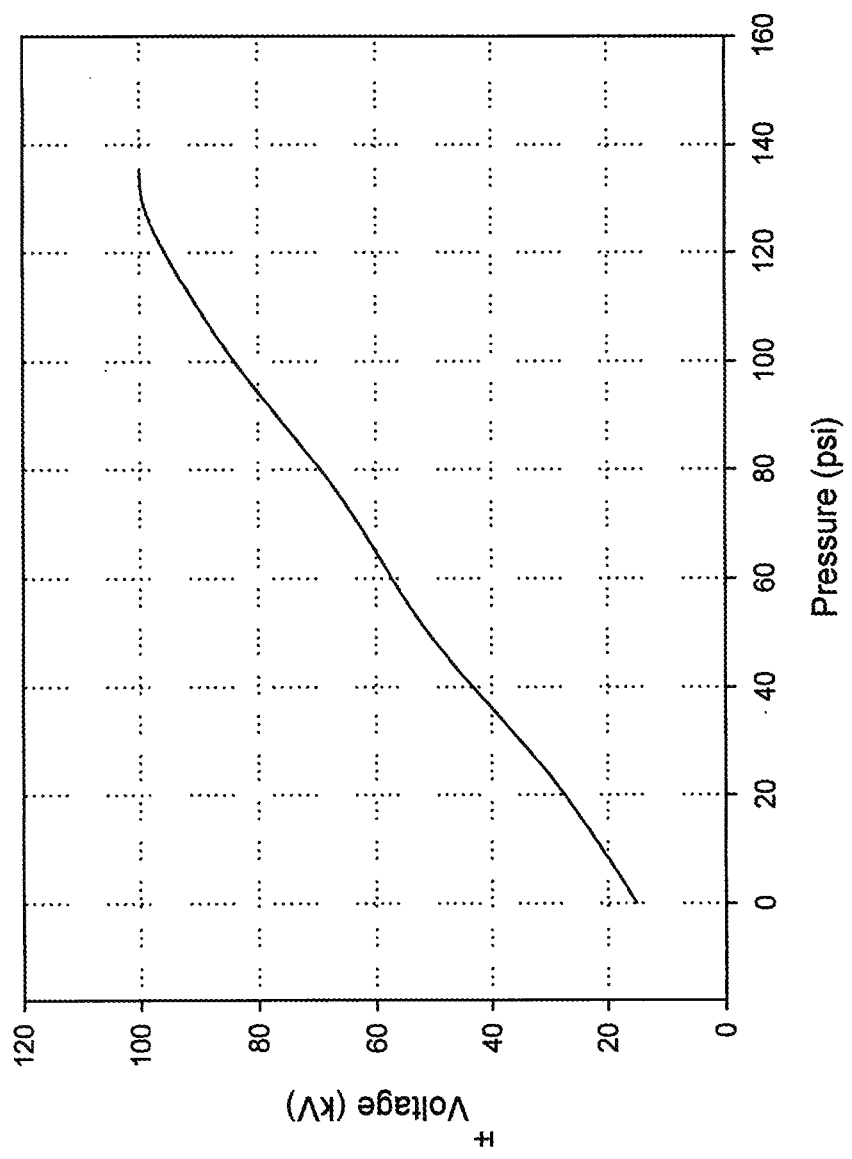
FIG. 8 is a graph of the self-break voltage as a function of pressure for the gas switch.

FIG. 8 shows the self-break voltage as a function of dry air pressure for the switch after the initial 1,000 shots. The self-breakdown voltage increases nearly linearly to +1-100 kV at 130 psi.

Figure 9A:
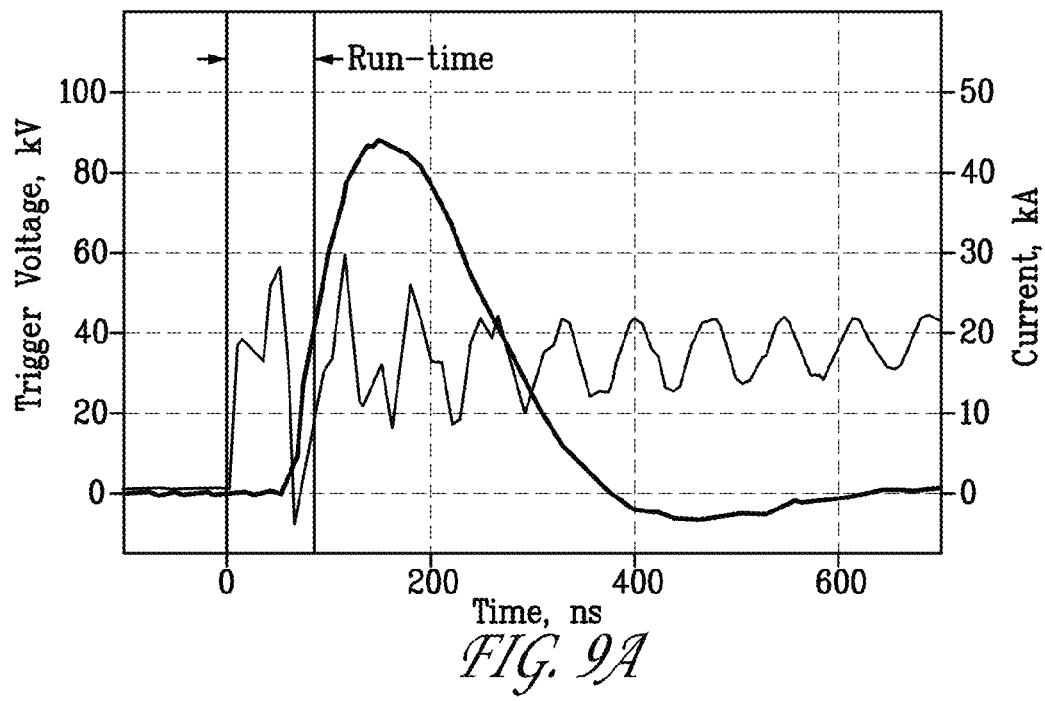
FIG. 9A is a graph of typical trigger voltage and switch current waveforms.
Figure 9B:
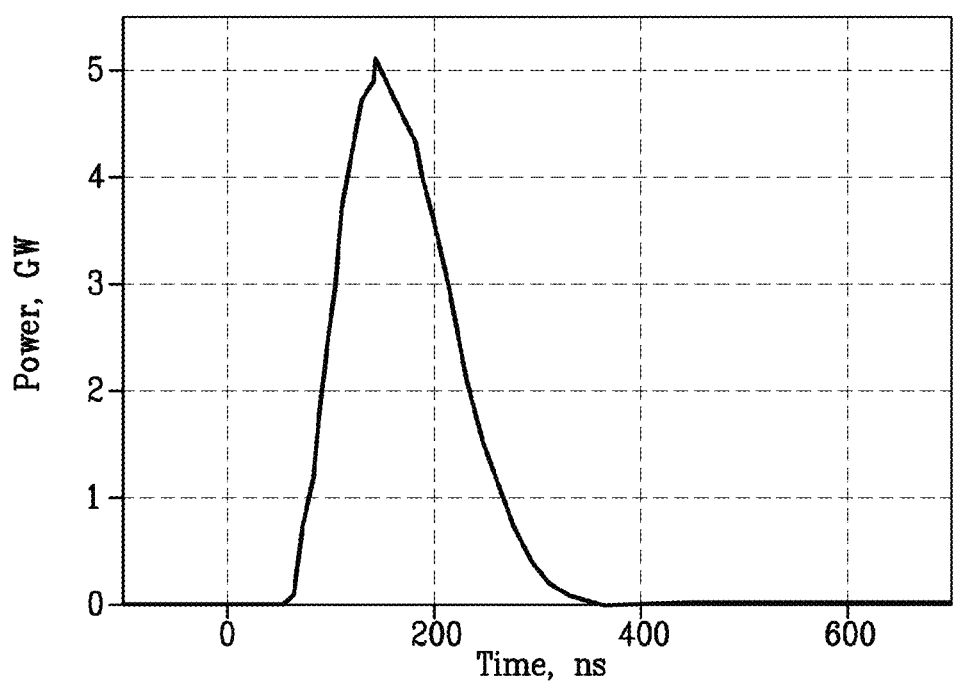
FIG. 9B is a graph of a typical switch power waveform.

FIG. 9A shows typical voltage and current waveforms after the initial 1,000 shots. The 60 nF capacitors were charged to +1-100 kV. The flowing resistive load was adjusted so that the system was at a near matched condition load with only a small current reversal. The trigger voltage was near 100 kV with a 10-90% rise time of 48 ns. FIG. 9B is a graph of the switch power waveform.

Figure 10:
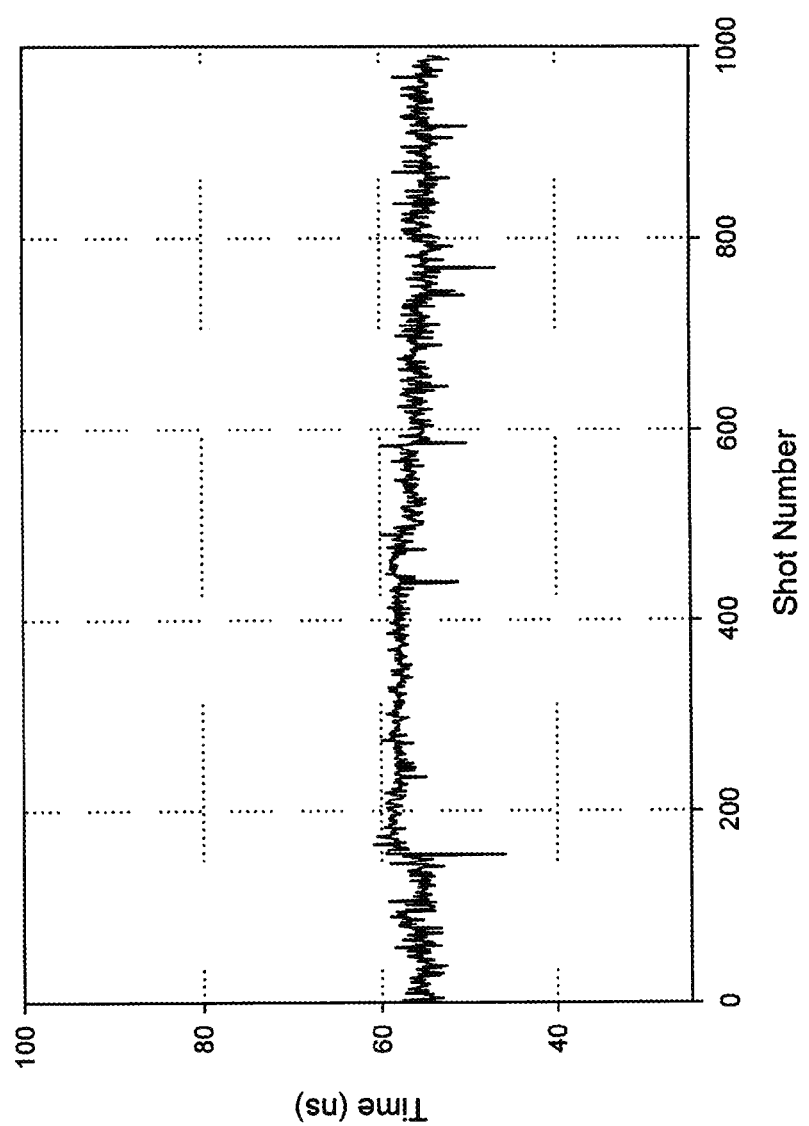
FIG. 10 is a graph of trigger delay after 25,000 shots.
Figure 11:
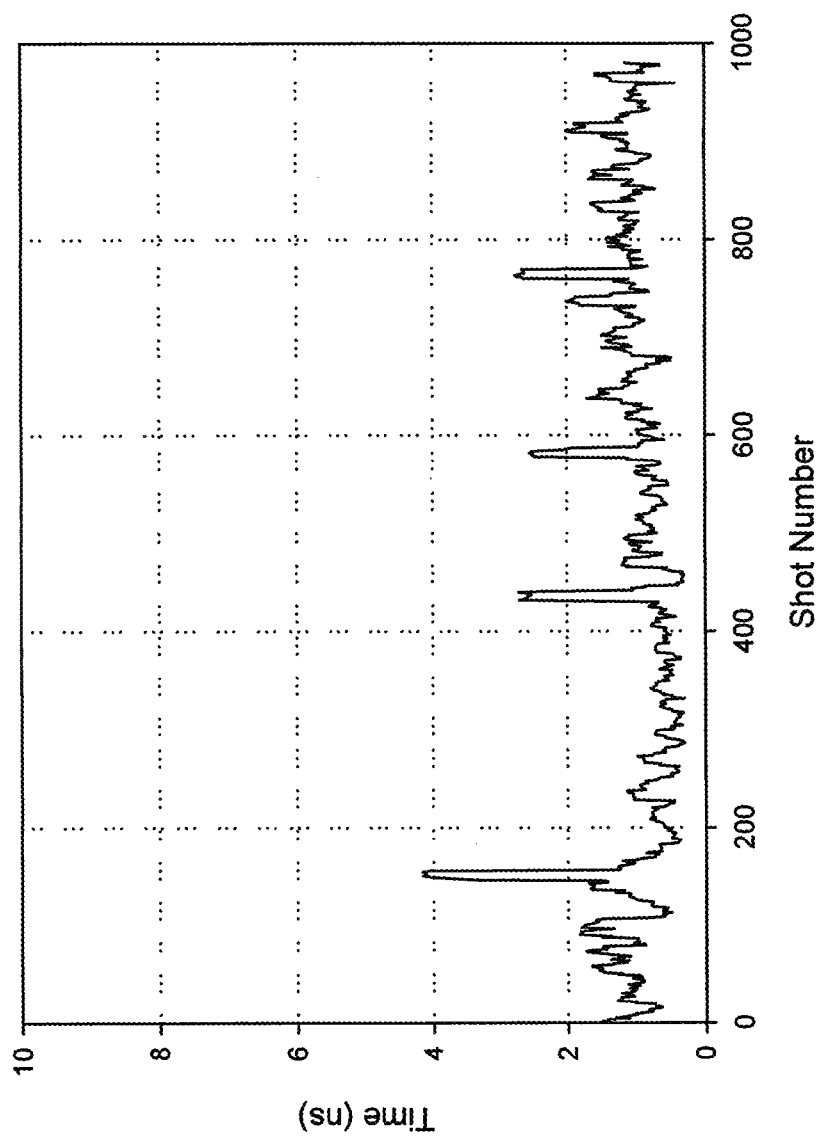
FIG. 11 is a graph of trigger jitter (RMS) after 25,000 shots.

FIG. 10 shows the trigger delay for 1000 shots after an additional 24,000 shots had been performed. FIG. 11 shows the trigger jitter (RMS) for 1000 shots after an additional 24,000 shots had been performed. The switch had an average trigger delay of about 56 ns with a 1-σ jitter of +1-1.2 ns.

Figure 12:
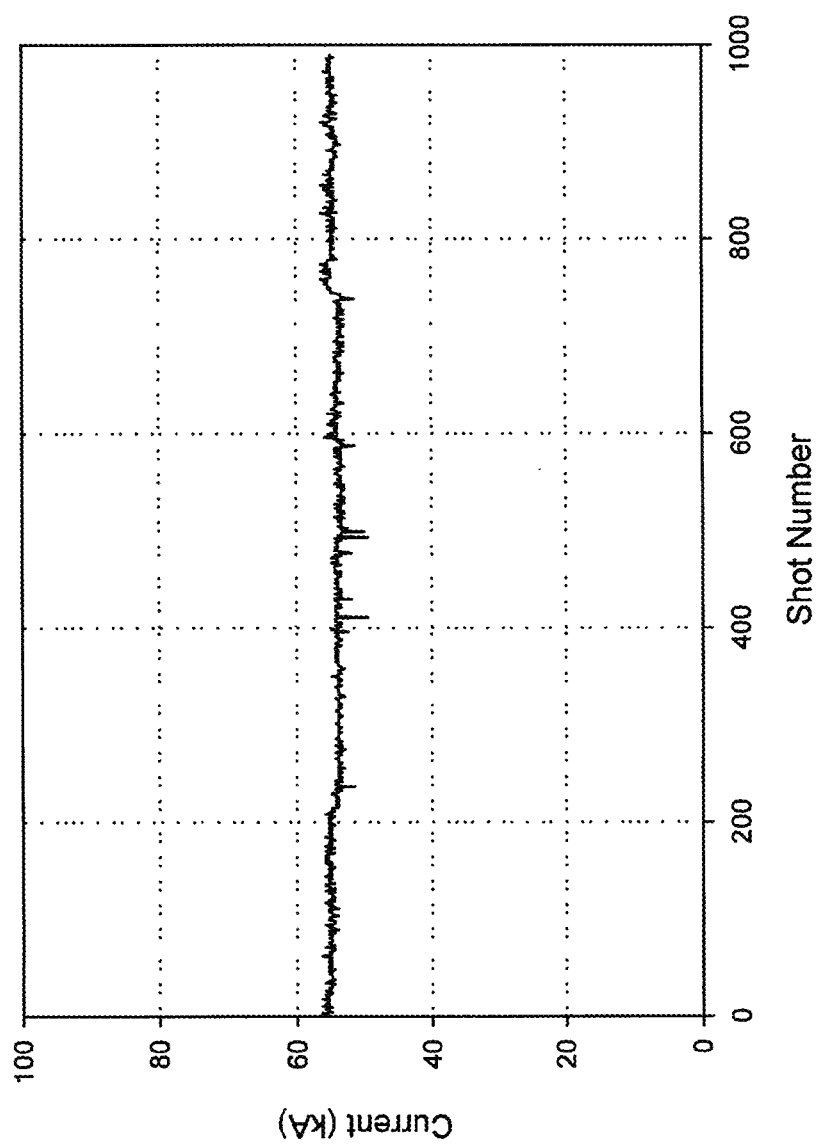
FIG. 12 is a graph of peak current after 25,000 shots.
Figure 13:
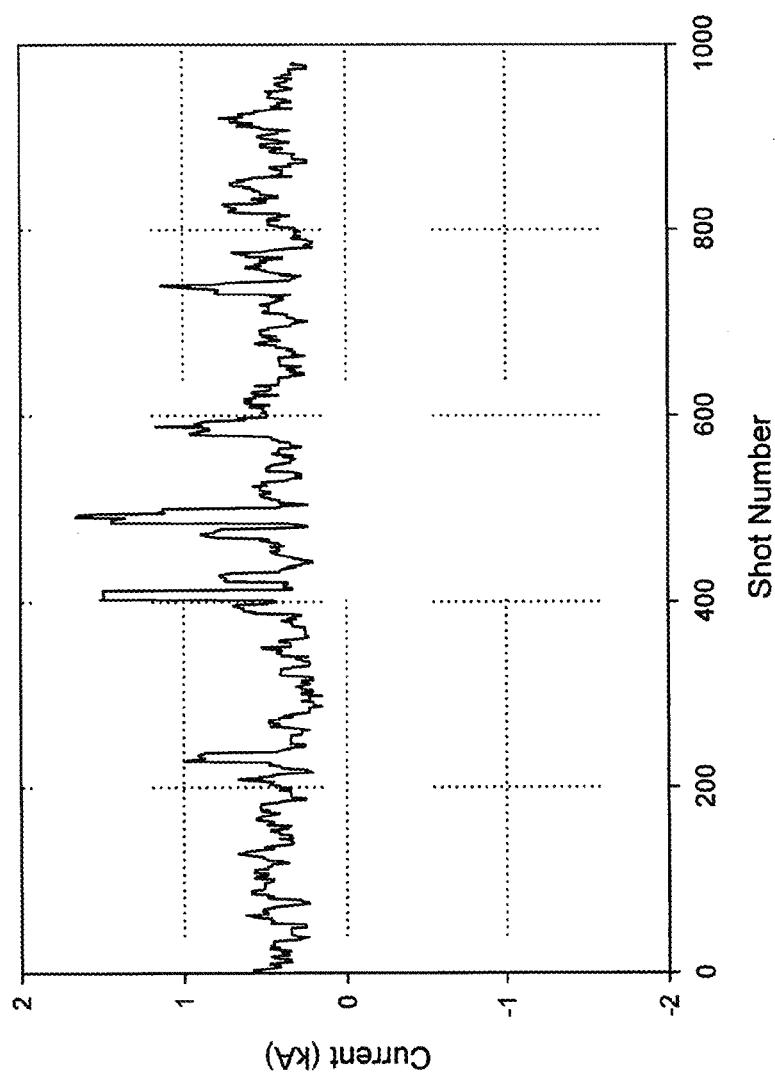
FIG. 13 is a graph of peak current jitter (RMS) after 25,000 shots.

FIG. 12 shows the peak current for 1000 shots after an additional 24,000 shots had been performed. The peak load current was about 58.7 kA. FIG. 13 shows the peak current jitter (RMS) for 1000 shots after an additional 24,000 shots had been performed.

Figure 14:
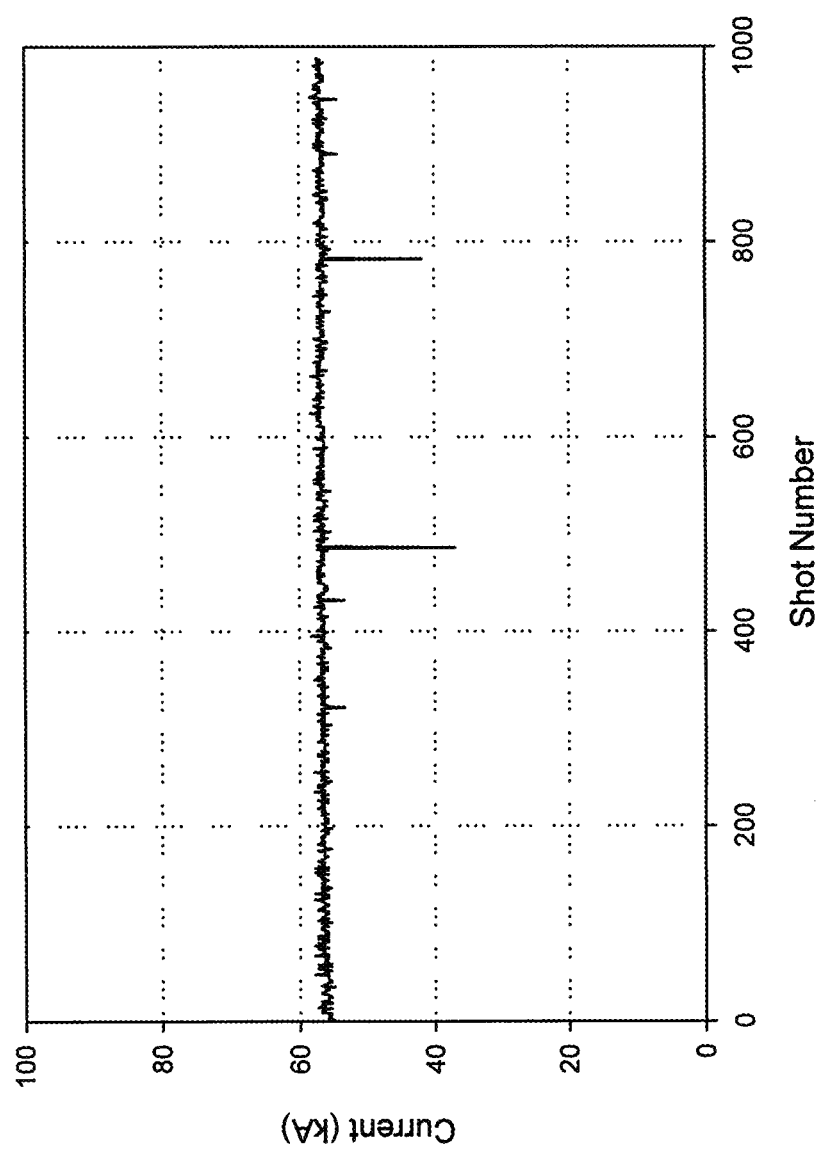
FIG. 14 is a graph of peak current after 50,000 shots.

The above data was typical up until after 50,000 shots at which point the switch started to prefire. FIG. 14 shows two prefires during the 1000 shots after 50,000 shots.

A summary of the test results is shown in Table 3.

TABLE 3

Performance of first exemplary gas switch.
Switch Performance

| | |
|---|---|
| Switch inductance | 35 nH |
| Switch jitter (one sigma) | 1.2 ns variation over 1000 shot test |
| Operational environment | 190 to 200 psi Ultra Zero Air |
| 10-90% rise time | 48 ns |
| 90-10% fall time | 90 ns |
| Rep rate | 0.125 Hz with 1 second purge at 200 psi |

TABLE 3-continued

Performance of first exemplary gas switch.
Switch Performance

| | |
|---|---|
| FWHM of current | 127 ns |
| Peak load current | 58.7 kA with 60 nF Caps |
| Lifetime | 57,200 |

The present invention has been described as a high-voltage, low-inductance gas switch. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A high-voltage, low-inductance gas switch, comprising:
a hollow housing pressurized with a gas;
a pair of axially symmetric opposing high voltage electrodes spaced apart and located on a centerline within the pressurized housing; and
an annular trigger ring disposed on a midplane between the opposing high voltage electrodes, wherein the surfaces of the trigger ring and the opposing high voltage electrodes are shaped to provide a uniform electric field in the gap formed therebetween.

2. The gas switch of claim 1, wherein the surfaces of the high voltage electrodes have a modified Rogowski profile.

3. The gas switch of claim 1, wherein the annular trigger ring has a double concave inner surface.

4. The gas switch of claim 1, further comprising at least one spark plug to provide a spark to pre-ionize the gas.

5. The gas switch of claim 1, wherein the gas comprises dry air.

6. The gas switch of claim 1, wherein the gas comprises nitrogen, hydrogen, or sulfur hexafluoride.

7. The gas switch of claim 1, wherein the housing is axially symmetric about the centerline.

8. The gas switch of claim 7, wherein the housing is a cylindrically symmetric housing with internal threads on each end and wherein each high voltage electrode is mounted on an externally threaded insulating end piece that can be rotatably inserted into opposing ends of the housing, thereby enabling adjustment of the spacing of the electrodes therebetween.

9. The gas switch of claim 1, wherein the annular trigger ring is mounted on the inside wall of an insulating tubular liner and wherein the outside wall of the tubular liner is compressibly sealed to the inner wall of the housing when the housing is pressurized.

* * * * *